(12) United States Patent
Yumoto et al.

(10) Patent No.: US 11,289,390 B2
(45) Date of Patent: Mar. 29, 2022

(54) INSULATION CIRCUIT BOARD WITH HEAT SINK

(71) Applicant: MITSUBISHI MATERIALS CORPORATION, Tokyo (JP)

(72) Inventors: Ryohei Yumoto, Saitama (JP); Tomoya Oohiraki, Saitama (JP); Takeshi Kitahara, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 17/040,236

(22) PCT Filed: Mar. 25, 2019

(86) PCT No.: PCT/JP2019/012325
§ 371 (c)(1),
(2) Date: Sep. 22, 2020

(87) PCT Pub. No.: WO2019/188884
PCT Pub. Date: Oct. 3, 2019

(65) Prior Publication Data
US 2021/0020530 A1 Jan. 21, 2021

(30) Foreign Application Priority Data
Mar. 27, 2018 (JP) .............................. JP2018-059658

(51) Int. Cl.
*H01L 23/14* (2006.01)
*H01L 23/373* (2006.01)

(52) U.S. Cl.
CPC ........ *H01L 23/142* (2013.01); *H01L 23/3735* (2013.01)

(58) Field of Classification Search
CPC . H05K 7/20509; H01L 21/4882; H01L 23/13; H01L 23/142; H01L 23/15;
(Continued)

(56) References Cited

U.S. PATENT DOCUMENTS

2012/0107642 A1* 5/2012 Meyer ................... C04B 37/021
428/623
2017/0338190 A1* 11/2017 Fujino ................. H01L 23/3735
2018/0366449 A1* 12/2018 Ikenouchi ............ H01L 23/3121

FOREIGN PATENT DOCUMENTS

EP          2447235 A1    5/2012
JP      2000-281465 A    10/2000
(Continued)

OTHER PUBLICATIONS

International Search Report dated May 21, 2019, issued for PCT/JP2019/012325.
(Continued)

*Primary Examiner* — Allan R Wilson
(74) *Attorney, Agent, or Firm* — Locke Lord LLP

(57) ABSTRACT

Provided with an insulation circuit board in which a circuit layer is joined to one side of a ceramic substrate and a metal layer made of aluminum or aluminum alloy is joined to the other side of the ceramic substrate, and a heat sink joined to the metal layer; the heat sink has a first metal layer made of copper joined to the metal layer, a ceramic board material joined to the first metal layer at an opposite side to the metal layer, and a second metal layer made of copper or copper alloy joined to an opposite side of the ceramic board material to the first metal layer; and a thickness T1 of the first metal layer is 0.3 mm to 3.0 mm inclusive and equal to or more than a thickness T2 of the second metal layer.

10 Claims, 2 Drawing Sheets

(58) Field of Classification Search
CPC ... H01L 23/36; H01L 23/367; H01L 23/3735; H01L 23/3736; H01L 23/485
See application file for complete search history.

(56) References Cited

FOREIGN PATENT DOCUMENTS

| | | |
|---|---|---|
| JP | 2001-135789 A | 5/2001 |
| JP | 2002-076214 A | 3/2002 |
| JP | 2006-156975 A | 6/2006 |
| JP | 2012-094867 A | 5/2012 |
| JP | 2013-247230 A | 12/2013 |
| JP | 2014-060215 A | 4/2014 |
| JP | 2014-143342 A | 8/2014 |
| JP | 2016-167502 A | 9/2016 |
| JP | 2017-212316 A | 11/2017 |

OTHER PUBLICATIONS

Supplementary European Search Report dated Dec. 1, 2021, issued for European Patent Application No. 19774225.7.

* cited by examiner

INSULATION CIRCUIT BOARD WITH HEAT SINK

BACKGROUND OF THE INVENTION

Technical Field

The present invention relates to an insulation circuit board with a heat sink in which a heat sink is bonded to an insulation circuit board such as a power module substrate used in a semiconductor device controlling large current and high voltage. Priority is claimed on Japanese Patent Application No. 2018-59658, filed on Mar. 27, 2018, the content of which is incorporated herein by reference.

Background Art

An insulation circuit board with a heat sink, in which a circuit layer is bonded to one side of an insulation layer consisting of aluminum nitride or the other ceramic substrates and an aluminum-based heat sink is bonded to the other side with an aluminum board therebetween, is known.

For example, in an insulation circuit board with heat sink disclosed in Patent Document 1, a circuit layer consisting any of a pure aluminum board, an aluminum alloy board, a pure copper board, a copper alloy board or the like is bonded to one side of an insulating layer consisting of a ceramic substrate, and a metal layer consisting of a metal board of pure aluminum or aluminum alloy is bonded to the other side of the insulating layer; to the metal layer, a heat sink formed from aluminum or aluminum alloy is bonded with a copper layer therebetween. In this case, the insulating layer and the metal layer are joined with a brazing material, and the metal layer and the heat sink are solid-phase diffusion bonded with the intervening copper layer.

In such insulation circuit boards with heat sinks, warping may occur due to the bonding of members with different thermal expansion coefficient, such as a ceramic substrate and an aluminum board. In order to prevent such warping, a composite with a low expansion coefficient, which is formed of a porous silicon carbide formed body disclosed in Patent Document 2 impregnated with a metal composed mainly of aluminum, is examined to be used as a material for the heat sink.

Patent Document 3 discloses a metal-ceramic-joined substrate (an insulation circuit board with a heat sink) formed by joining a first metal board on one side of a first ceramic substrate, joining a second metal board on the other side of the first ceramic substrate and one side of a second ceramic substrate, and joining a board-shape heat dissipation member having a plurality of fins on the other side of the second ceramic substrate. This metal-ceramic-joined substrate is formed by placing the first ceramic substrate and the second ceramic substrate in a carbon-made mold at intervals, and pouring melted aluminum alloy into the mold to cool and solidify it.

CITATION LIST

Patent Document 1: Japanese Unexamined Patent Application, First Publication No. 2014-60125
Patent Document 2: Japanese Unexamined Patent Application, First Publication No. 2000-281465
Patent Document 3: Japanese Unexamined Patent Application, First Publication No. 2017-212316

SUMMARY OF INVENTION

Problem to be Solved by Invention

The metal-ceramic-joined substrate disclosed in Patent Document 3 is manufactured by placing two ceramic substrate in a mold at intervals and pouring melted aluminum alloy into the mold; so that all the metal boards, heat dissipation members and fins are made of the same aluminum alloy.

The present invention is achieved in consideration of the above circumstances, and has an object to suppress warping of an insulation circuit board with a heat sink formed by joining a metal layer of an insulation circuit substrate and a heat sink made of different composition metal.

Solution to Problem

An insulation circuit board with a heat sink of the present invention is provided with an insulation circuit board provided with a ceramic substrate, a circuit layer joined to one side of the ceramic substrate, and a metal layer made of aluminum or aluminum alloy, which is joined to the other side of the ceramic substrate; and a heat sink joined to the metal layer. In the insulation circuit board with a heat sink, the heat sink includes a first metal layer with a thickness T1 made of copper or copper alloy joined to the metal layer, a ceramic board material joined to an opposite side surface of the first metal layer to the metal layer, and a second metal layer with a thickness T2 made of copper or copper alloy joined to an opposite side surface to the first metal layer of the ceramic board material, and the thickness T1 of the first metal layer is not less than 0.3 mm and not more than 3.0 mm, and a thickness ratio T1/T2 is 1.0 or more.

In the present invention, the heat sink is composed of the first metal layer joined to the metal layer of the insulation circuit board, the ceramic board material joined to the first metal layer, and the second metal layer joined to the ceramic board material. That is to say, since the ceramic board material is incorporated inside the first metal layer and the second metal layer which are made of copper or copper alloy, the linear expansion coefficient of the heat sink can be small and the difference of the linear expansion to the insulation circuit board can be small. Thereby, the warping change amount between high temperature and low temperature of the insulation circuit board with a heat sink can be suppressed.

Thickness T1 of the first metal layer is set to 0.3 mm to 3.0 mm inclusive; because if the thickness T1 of the first metal layer is less than 0.3 mm, the heat dissipation effect of the heat sink may be deteriorated, and if the thickness T1 is more than 3.0 mm, the influence of expansion of the first metal layer made of copper or copper alloy is large, the linear expansion of a bonded body to the ceramic board material (the heat sink) is increased, so that the warping of the insulation circuit board with the heat sink which is the bonded body of the insulation circuit board and the heat sink is increased. If the thickness T1 of the first metal layer is less than the thickness T1 of the second metal layer, the insulation circuit board with the heat sink may warp convexly toward the insulation circuit side when it is heated, so that T1/T2 is set to 1.0 or more.

As a preferred aspect of the insulation circuit board with a heat sink of the present invention, the thickness ratio T1/T2 is preferably not more than 10.0.

As a preferred aspect of the insulation circuit board with a heat sink of the present invention, the thickness T2 of the second metal layer T2 is preferably not less than 0.3.

As a preferred aspect of the insulation circuit board with a heat sink of the present invention, it is preferable that the circuit layer be formed from aluminum or aluminum alloy, the ceramic substrate be formed from aluminum nitride, and the ceramic board material be formed from silicon nitride.

As a preferred aspect of the insulation circuit board with a heat sink of the present invention, the metal layer and the first metal layer are preferably solid-phase diffusion bonded.

Advantageous Effects of Invention

According to the present invention, it is possible to suppress the warping of the insulation circuit substrate with a heat sink in which the insulation circuit substrate having the metal layer and the heat sink having the metal layer with the different composition from the metal layer of the insulation circuit substrate are bonded.

DESCRIPTION OF EMBODIMENTS

Figure 1:
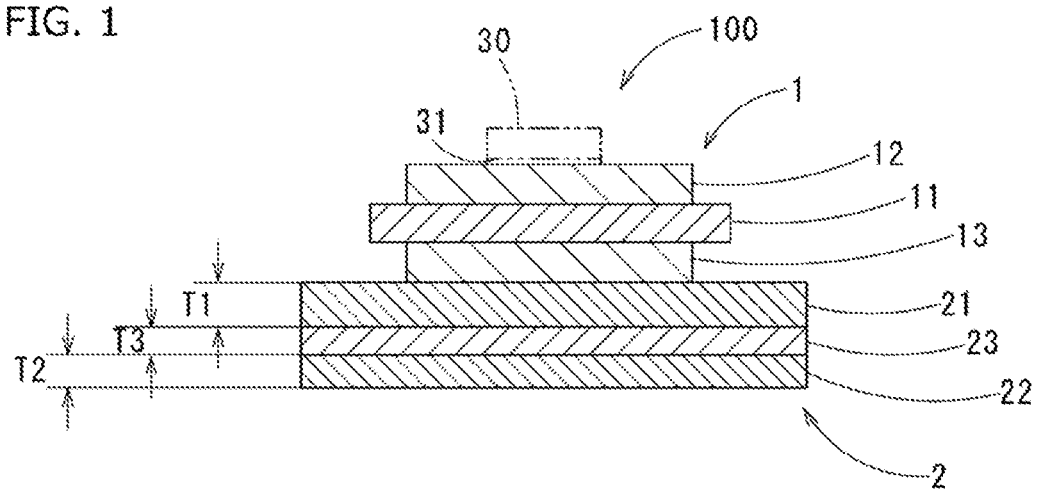
FIG. 1 is a cross sectional view showing a power module in which an insulation circuit board with a heat sink according to an embodiment of the present invention is used.

Below, embodiments of the present invention will be explained referring to the drawings.
[Schematic Structure of Insulation Circuit Board]

An insulation circuit board 100 with a heat sink according to the present invention is formed by joining a heat sink 2 to an insulation circuit board 1 as shown in FIG. 1 and used as a substrate for a power module, for example. The insulation circuit board 100 with a heat sink, in which an element 30 is mounted on a surface (a top surface), as shown by the double-dotted line in FIG. 1, and becomes a power module.

The element 30 is an electronic component having a semiconductor; and various semiconductor elements are selected, such as IGBT (insulated gate bipolar transistor), MOSFET (metal oxide semiconductor field effect transistor), FWD (free wheeling diode), and the like. In this case, although illustrate is omitted, the element 30 is provided with an upper electrode part on an upper part and a lower electrode part on a lower part. The lower electrode is joined on an upper side of a circuit layer 12 by a solder 31 or the like, so that the element 30 is mounted on the upper side of the circuit layer 12. The upper electrode part of the element 30 is connected to a circuit electrode part or the like of the circuit layer 12 via a lead frame joined by a solder or the like, so that the power module is manufactured.

[Structure of Insulation Circuit Board]

The insulation circuit board 1 is provided with a ceramic substrate 11, the circuit layer 12 joined on one side of the ceramic substrate 11, and a metal layer 13 joined on the other side of the ceramic substrate 11.

The ceramic substrate 11 is a rectangular board-like insulation substrate preventing electric connection between the circuit layer 12 and the metal layer 13, and is formed of, for example, aluminum nitride (AlN), silicon nitride ($Si_3N_4$), aluminum oxide ($Al_2O_3$), a zirconia-reinforced alumina substrate, or the like, having a thickness of 0.2 mm to 1.2 mm. In a case in which the circuit layer 12 and the metal layer 13 joined on both sides of the ceramic substrate 11 are both formed of aluminum or aluminum alloy, it is preferable to be formed from aluminum nitride.

A planar size of the ceramic substrate 11 is not particularly limited, though is set to 40 mm to 140 mm×40 mm to 100 mm in the present embodiment.

The circuit layer 12 is joined on an upper side (a surface) of the ceramic substrate 11, and aluminum alloy or pure aluminum having a purity of 99 mass % or more is used, and a thickness thereof is, for example, 0.2 mm to 0.9 mm inclusive.

A planar size of the layer 12 is smaller than that of the layer 11, and is set to 36 mm to 136 mm×36 mm to 96 mm in this embodiment, though not particularly limited.

The metal layer 13 is joined on a lower surface (a rear surface) of the ceramic substrate 11, and aluminum alloy or pure aluminum having purity of 99 mass % or more is used: in JIS standard, aluminum in the insulation circuit board 100 with a heat sink0s, especially 1N99 (99.99 mass % or more purity: what is called 4N aluminum) can be used. A thickness thereof is, for example, 0.2 mm to 0.9 mm.

A planar size of the metal layer 13 is smaller than that of the ceramic substrate 11, though not particularly limited, and in this embodiment it is set to be 36 mm to 136 mm×36 mm to 96 mm which is the same as that of the circuit layer 12. It is preferable that the circuit layer 12 and the metal layer 13 have the same composition, the same thickness, and the same size.

[Structure of Heat Sink]

The heat sink 2 is joined on the insulation circuit board 1 to dissipate heat transmitted from the insulation circuit board 1. The heat sink 2 is composed of a first metal layer 21 joined to the metal layer 13 of the insulation circuit board 1, a ceramic board material 23 joined on a lower surface (a rear surface) of the first metal layer 21, and a second metal layer 22 joined on a lower surface (a rear surface) of the ceramic board material 23.

The first metal layer 21 is formed from copper or copper alloy, and a thickness T1 thereof is set to 0.3 mm to 3.0 mm inclusive. The second metal layer 22 is formed from copper or copper alloy, and a thickness T1 thereof is set to 0.3 mm to 3.0 mm inclusive.

If the thickness of the first metal layer 21 is less than 0.3 mm, the heat dissipation effect of the heat sink 2 may be deteriorated; and if it is more than 3.0 mm, linear expansion of the ceramic board material 23 and a joined body (the heat sink 2) is increased, so that warping of the insulation circuit board 100 with a heat sink, which is a joined body of the insulation circuit board 1 and the heat sink 2, is increased. If the thickness of the first metal layer 21 is smaller than the thickness of the second metal layer 22, the heat sink 2 may be bended to be convex toward the first metal layer 21 when heated. Therefore, the thickness T1 of the first metal layer 21 is set to 0.3 mm to 3.0 mm inclusive and equal to or more than the thickness T2 of the second metal layer 22 (equal to the T2 of the second metal layer 22 or larger than the thickness T2).

A thickness ratio T1/T2 of the thickness T1 of the first metal layer 21 and the thickness T2 of the second metal layer 22 is 1.0 or more, and preferably 10.0 or less.

The ceramic board material 23 is provided to reduce a difference of linear expansion between the heat sink 2 and the insulation circuit board 1, and formed of silicon nitride ($Si_3N_4$), aluminum nitride (AlN), aluminum oxide ($Al_2O_3$), zirconia-reinforced alumina substrate or the like, and is set to have a thickness T3 of 0.2 mm to 1.2 mm.

Planar sizes of the first metal layer 21, the second metal layer 22 and the ceramic board material 23 are larger than that of the ceramic substrate 11, and are set to the same size, though not particularly limited, for example, 50 mm to 180 mm×60 mm to 140 mm. The ceramic board material 23 is preferably made of silicon nitride because the first metal layer 21 and the second metal layer 22 made of copper or copper alloy are joined to both surfaces thereof.

Figure 2:
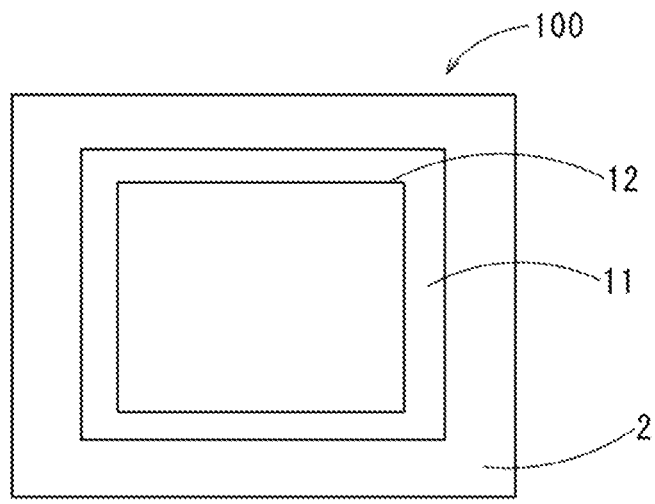
FIG. 2 is a plan view of the insulation circuit board with a heat sink in the above-mentioned embodiment viewed from a circuit layer side.

When the insulation circuit board 100 with a heat sink is viewed from the circuit layer 12 side, as shown in FIG. 2, the ceramic substrate 11 is larger than the circuit layer 12, and the heat sink 2 (the first metal layer 21, the second metal layer 22 and the ceramic board material 23) is larger than the ceramic substrate 11.

As described above, the heat sink 2 has a structure in which the ceramic board material 23 is incorporated inside the first metal layer 21 and the second metal layer 22 made of copper or copper alloy.

[Method of Manufacturing Insulation Circuit Board with Heat Sink]

Next, a method of manufacturing the insulation circuit board 100 with a heat sink of the present embodiment will be explained.

Figure 3A:
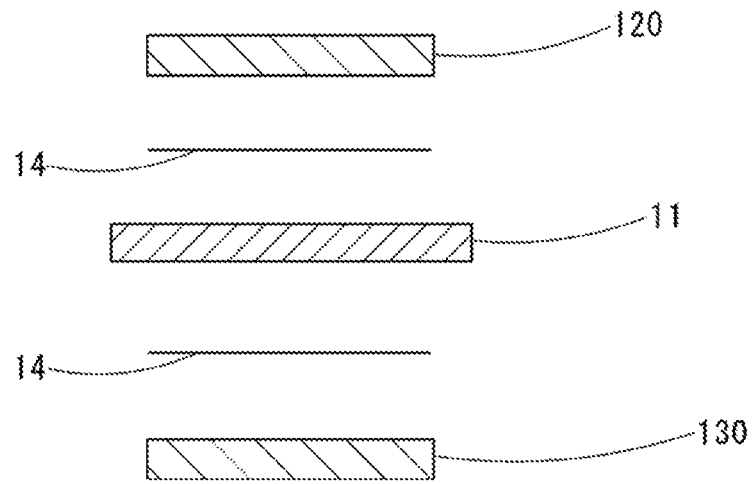
FIG. 3A is a cross sectional view explaining a method of manufacturing the insulation circuit board with a heat sink shown in FIG. 1.
Figure 3B:
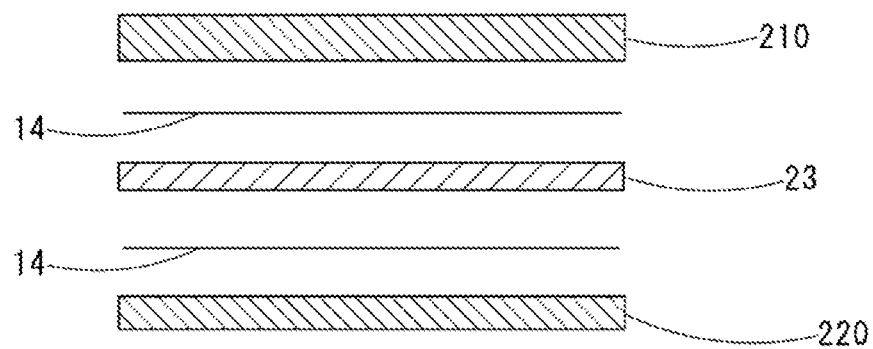
FIG. 3B is a cross sectional view explaining a method of manufacturing the insulation circuit board with a heat sink shown in FIG. 1.
Figure 3C:
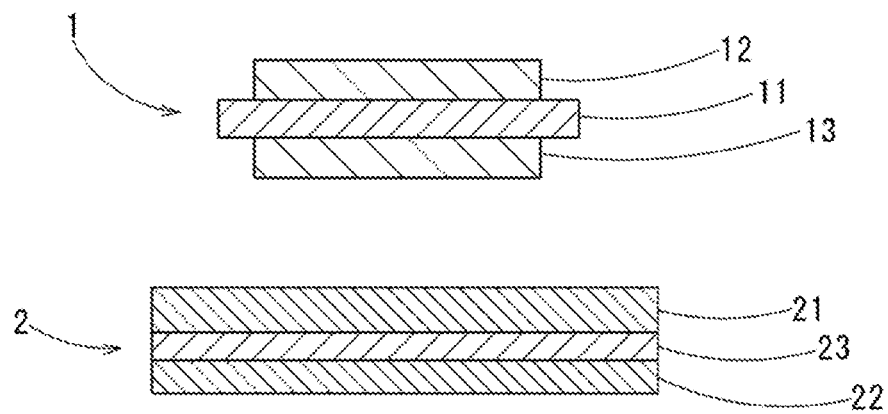
FIG. 3C is a cross sectional view explaining a method of manufacturing the insulation circuit board with a heat sink shown in FIG. 1.

The method of manufacturing the insulation circuit board 100 with a heat sink includes, as shown in FIGS. 3A to 3C, a manufacturing step of an insulation circuit board for bonding a metal plate 120 for a circuit layer and a metal board 130 for a metal layer which are made of pure aluminum or aluminum alloy to the ceramic substrate 11 (FIG. 3A); a manufacturing step of a heat sink for bonding a metal board 210 for the first metal layer and a metal board 220 for the second metal layer which are made of copper or copper alloy the ceramic board material 23 (FIG. 3B); and a joining step for bonding the insulation circuit board 1 and the heat sink 2 (FIG. 3C). Below, it will be explained in order of these steps.

(Step of Manufacturing Insulation Circuit Board)

First, as shown in FIG. 3A, the metal board 120 for a circuit layer and the metal board 130 for a metal layer are bonded to the ceramic substrate 11 respectively using Al—Si type brazing material. Specifically, on a front surface (an upper surface) and a rear surface (a lower surface) of the ceramic substrate 11, the metal board 120 for a circuit layer and the metal board 130 for a metal layer are laminated with Al—Si type brazing material foils 14 with intervening therebetween; by holding a laminated body of them between carbon boards and heating it in vacuum with applying a load in a lamination direction, the metal board 120 for a circuit layer and the metal board 130 for a metal layer are bonded to the ceramic substrate 11. Thereby, the circuit layer 12 is bonded on the front surface (the upper surface) of the ceramic substrate 11 with a bonding part (a brazing part) therebetween, and the metal layer 13 is bonded to the back surface (the lower surface) with a bonding part (a brazing part) therebetween; so that the insulation circuit board 1 is formed.

The force applied in the lamination direction is preferably 0.3 MPa to 1.5 MPa, and the heating temperature is preferably 630° C. to 655° C. inclusive. The Al—Si type brazing material foil has a thickness preferably 5 μm to 15 μm. In addition to the Al—Si type brazing material, Al—Ge, Al—Cu, Al—Mg, Al—Mn, or Al—Si—Mg type brazing material can be used.

(Step of Manufacturing Heat Sink)

Next, as shown in FIG. 3B, the metal board 210 for the metal layer having the thickness T1 of 0.3 mm to 3.0 mm and the metal board 220 for the second metal layer having the thickness T2 of 0.3 mm to 3.0 mm and smaller than T1 are respectively bonded to the ceramic board material 23 having the thickness T3 of 0.2 mm to 1.2 mm using Ag—Cu—Ti type brazing material. Specifically, on a front surface (an upper surface) and a rear surface (a lower surface) of the ceramic board material 23, the metal board 210 for the metal layer and the metal board 220 for the second metal layer are respectively laminated with intervening the Ag—Cu—Ti type brazing material foils 14; and by holding a laminate body of them between carbon sheets and heating in vacuum with adding a load in a lamination direction, the metal board 210 for the metal layer and the metal board 220 for the second metal layer are bonded to the ceramic board material 23. Thereby, the heat sink 2 is formed, in which, on the ceramic board material 23, the first metal layer 21 having the thickness T1 of 0.3 mm to 3.0 mm is bonded to the front surface (the upper surface) with intervening a bonding part (a brazing part), and the second metal layer 22 having the thickness T2 of 0.3 mm to 3.0 mm and smaller than the thickness T1 of the first metal layer 21 is bonded to the rear surface (the lower surface) with intervening a bonding part (a brazing part).

The force applied in the lamination direction is preferably 0.1 MPa to 1.0 MPa, and the heating temperature is preferably 800° C. to 930° C. The Ag—Cu—Ti type brazing foil has preferably a thickness of 5 μm to 15 μm. In addition to the Ag—Cu—Ti type brazing material, Cu—P type brazing material can be used.

(Bonding Step)

Then, the insulation circuit board 1 and the heat sink 2 are solid-phase diffusion bonded. Specifically, as shown in FIG. 3C, by laminating the metal layer 13 of the insulation circuit board 1 on the heat sink 2, and heating to a bonding temperature under a vacuum atmosphere in a state in which a laminate body of them is pressed in a laminate direction, the metal layer 13 and the heat sink 2 are solid-phase diffusion bonded. In this case, the pressure force is, for example, 0.5 MPa to 2.0 MPa and the heating temperature is 500° C. to 540° C., and this pressuring and heating state is maintained for 30 minutes to 120 minutes. Thereby, the metal layer 13 and the heat sink 2 are bonded, and as shown in FIG. 1, the insulation circuit board 100 with a heat sink is obtained.

In the present embodiment, a bonded surface of the metal layer 13 and a bonded surface of the heat sink 2 are solid-phase diffusion bonded after smoothing by removing scratches in advance.

In a case in which the heat sink is formed from one board of copper or copper alloy, since a difference of linear expansion to the metal layer 13 made of aluminum or aluminum alloy in the insulation circuit board 1 is large, expansion ratio in high temperature and contraction coefficient in low temperature are different, and the warpage of the insulation circuit board 100 with a heat sink is large.

In contrast, in the present embodiment, the heat sink 2 is composed of the first metal layer 21 bonded to the metal layer 13 of the insulation circuit board 1, the ceramic board material 23 bonded to the first metal layer 21, and the second metal layer 22 bonded to the ceramic board material 23. That is to say, the ceramic board material 23 is incorporated inside the first metal layer 21 and the second metal layer 22 which are made of copper or copper alloy, the linear expansion coefficient of the heat sink 2 can be small, and the difference of the linear expansion to the insulation circuit board 1 can be small.

Since the thickness T1 of the first metal layer 21 is not less than 0.3 mm and not more than 3.0 mm, and more than the thickness T2 of the second metal layer 22 (T1≥T2), the warpage of the heat sink 2 can be suppressed while maintaining the heat dissipation effect of the heat sink 2; and an amount of warp change of the insulation circuit board 100 with a heat sink between high temperature and low temperature can be further suppressed.

In addition, details are not limited to the structure of the embodiment and various modifications may be made without departing from the scope of the present invention.

For example, although the circuit layer 12 is made of aluminum or aluminum alloy in the above-mentioned embodiment, it is not limited to this and may be formed from oxygen free copper, for example. That is to say, the composition of the circuit layer 12 is not specified.

In the above embodiment, an example of using the insulation circuit board 100 with a heat sink as a power module substrate with a heat sink was explained; however, the insulation circuit board 100 with a heat sink can be also used as various insulation substrates such as a substrate for LED elements and the like.

EXAMPLES

Next, effects of the present invention will be explained in detail using examples; though, the present invention is not limited to the below examples.

Insulation circuit substrates composing test pieces of Examples 1 to 18, Comparative Examples 1 to 3 and a conventional example were prepared by manufacturing circuit layers having a thickness of 0.4 mm and metal layers having a thickness of 0.4 mm on ceramic substrate having a planar size of 120 mm×90 mm by the manufacturing method described in the above embodiment; and the circuit layers and the metal layers were prepared to have the composition shown in Table 1.

As heat sinks composing the material of Examples 1 to 18 and Comparative Examples 1 to 3, first metal layers and second metal layers formed from oxygen free copper were manufactured on ceramic substrates having a planar size of 140 mm×100 mm by the manufacturing method described in above-mentioned embodiment; and the circuit layers and the metal layers were prepared to have the thickness shown in Table 1. Regarding the conventional example, a heat sink formed from one board of oxygen free copper having a planar size of 140 mm×100 mm was manufactured.

Then, the insulation circuit substrate and the heat sink were bonded by the bonding method described in the above-mentioned embodiment, and the obtained test pieces were experimented by the following tests.

(Warping Change Amount)

Regarding the obtained test pieces, in a sequential heating test in which heating from 30° C. to 285° C. and then cooling to 30° C., a warping amount at heated to 285° C. and a warping amount at cooled to 30° C. after heated to 285° C. (a warping amount at cooled to 30° C.) were measured to find deformation of the test pieces owing to temperature change as the warping change amount.

The warping amount was measured using a moiré-type three-dimensional shape measuring device (thermal warpage and strain measurement device TherMoire PS200 made by Akrometrix, LLC), taking a center (an area of 100 mm×80 mm) of the second metal layer of the heat sink as a measured surface. More specifically, a least-squares surface was found from a profile of the measured surface and the warping amount was obtained by finding a difference (absolute value) between a highest point and a lowest point on basis of the surface.

The warping amount obtained as above is set to be whether positive or negative in accordance with the warping condition. That is to say, it was set to be a positive value in a case in which the center of the measured area was nearer to the circuit layer side than a surface formed by four corners of the measured area (the second metal layer was convex toward the circuit layer side) and a case in which the center of the measured area was on the surface formed by the four corners of the measured surface; and it was set to be a negative value in a case in which the center of the measured area was further from the circuit layer side than the surface formed by the four corners of the measured area (the second metal layer was convex toward the heat sink side).

Positive or negative was set as above, the absolute value of the difference between the warping amount at heated to 285° C. and the warping amount at cooled to 30° C. (the warping amount at heated to 285° C. in which positive or negative was set—the warping amount at cooled to 30° C. in which positive or negative was set) was the warping change amount.

(Evaluation of Element Position Deviation)

In evaluation of element position deviation was confirmed, occurrence of the position deviation was confirmed with manufacturing 30 test pieces, by soldering an electronic component on the circuit layer and then measuring the soldered position. A case in which the position deviation of 0.2 mm or more occurred was evaluated as defected, and it was evaluated as acceptable if the position deviation was less than 0.2 mm.

In each evaluation performed on the element 30 test pieces, a case in which an acceptable ratio was 90% or more was evaluated as good "A", and a case in which the acceptable ratio was less than 90% was evaluated rejected "B".

(Evaluation of Cold/Hot Cycle Reliability)

On the insulation circuit substrates with a heat sink of Examples 1 to 18, Comparative Examples 1 to 3 and Conventional Example, after performing a temperature cycle test by changing temperature 1000 times between −50° C. to 175° C., it was judged by sight whether or not a breakage was found in the ceramic substrate of the insulation circuit substrate. If there was a breakage in the ceramic substrate it was determined to be rejected "B", and if there was no breakage in the ceramic substrate it was determined to be good "A". Table 2 shows result of the warping change amount, the evaluation of element position deviation and the evaluation of the cold/hot cycle reliability.

TABLE 1

| | | Insulation Circuit Substrate | | | Heat Sink | | | |
|---|---|---|---|---|---|---|---|---|
| | | Circuit Layer | Ceramic Substrate | Metal Layer | 1st Metal Layer T1(mm) | Ceramic Board Material | 2nd Metal Layer T2(mm) | T1/T2 |
| Example | 1 | 4N—Al | AlN | 4N—Al | 0.6 | $Si_3N_4$ | 0.3 | 2.0 |
| | 2 | 4N—Al | AlN | 4N—Al | 0.3 | $Si_3N_4$ | 0.3 | 1.0 |
| | 3 | 4N—Al | AlN | 4N—Al | 1.0 | $Si_3N_4$ | 0.3 | 3.3 |
| | 4 | 4N—Al | AlN | 4N—Al | 2.0 | $Si_3N_4$ | 0.3 | 6.7 |
| | 5 | 4N—Al | AlN | 4N—Al | 3.0 | $Si_3N_4$ | 0.3 | 10.0 |
| | 6 | 4N—Al | AlN | 4N—Al | 0.6 | $Si_3N_4$ | 0.1 | 6.0 |
| | 7 | 4N—Al | AlN | 4N—Al | 1.0 | $Si_3N_4$ | 0.6 | 1.7 |
| | 8 | 4N—Al | AlN | 4N—Al | 3.0 | $Si_3N_4$ | 3.0 | 1.0 |
| | 9 | 4N—Al | AlN | 4N—Al | 0.6 | AlN | 0.3 | 2.0 |
| | 10 | 4N—Al | AlN | 4N—Al | 0.6 | $Al_2O_3$ | 0.3 | 2.0 |
| | 11 | OFC | AlN | 4N—Al | 0.6 | $Si_3N_4$ | 0.3 | 2.0 |
| | 12 | 2N—Al | AlN | 4N—Al | 0.6 | $Si_3N_4$ | 0.3 | 2.0 |
| | 13 | ADC12 | AlN | 4N—Al | 0.6 | $Si_3N_4$ | 0.3 | 2.0 |
| | 14 | OFC/ 4N—Al | AlN | 4N—Al | 0.6 | $Si_3N_4$ | 0.3 | 2.0 |
| | 15 | 4N—Al | AlN | 2N—Al | 0.6 | $Si_3N_4$ | 0.3 | 2.0 |
| | 16 | 4N—Al | AlN | ADC12 | 0.6 | $Si_3N_4$ | 0.3 | 2.0 |
| | 17 | 4N—Al | $Si_3N_4$ | 4N—Al | 0.6 | $Si_3N_4$ | 0.3 | 2.0 |
| | 18 | 4N—Al | $Al_2O_3$ | 4N—Al | 0.6 | $Si_3N_4$ | 0.3 | 2.0 |
| Comparative Example | 1 | 4N—Al | AlN | 4N—Al | 4.0 | $Si_3N_4$ | 0.3 | 13.3 |
| | 2 | 4N—Al | AlN | 4N—Al | 4.0 | $Si_3N_4$ | 3.0 | 1.3 |
| | 3 | 4N—Al | AlN | 4N—Al | 0.9 | $Si_3N_4$ | 1.0 | 0.9 |
| Conventional Example | | 4N—Al | AlN | 4N—Al | 5.0 | — | — | — |

TABLE 2

| | | Difference of Warping (mm) | Element Position Deviation | Cold/Hot Cycle Reliability |
|---|---|---|---|---|
| Example | 1 | 0.29 | A | A |
| | 2 | 0.32 | A | A |
| | 3 | 0.54 | A | A |
| | 4 | 0.77 | A | A |
| | 5 | 1.10 | A | A |
| | 6 | 0.19 | A | A |
| | 7 | 0.89 | A | A |
| | 8 | 1.20 | A | A |
| | 9 | 0.35 | A | A |
| | 10 | 0.39 | A | A |
| | 11 | 0.41 | A | A |
| | 12 | 0.35 | A | A |
| | 13 | 0.37 | A | A |
| | 14 | 0.36 | A | A |
| | 15 | 0.36 | A | A |
| | 16 | 0.33 | A | A |
| | 17 | 0.42 | A | A |
| | 18 | 0.46 | A | A |
| Comparative Example | 1 | 1.23 | A | B |
| | 2 | 1.28 | A | B |
| | 3 | 1.35 | B | A |
| Conventional Example | | 1.30 | B | B |

As known from Table 2, in Examples 1 to 18, the warping change amount was small as 1.20 mm or less, and the evaluations of the element position deviation and the cold/hot cycle reliability were good "A". Therefore, it was found that the thickness T1 of the first metal layer of the heat sink was 0.3 mm to 3.0 mm (inclusive) and equal to or more than the thickness T2 of the second metal layer (T1≥T2).

By contrast, in Comparative Examples 1 and 2, although the evaluation of the element position deviation were good "A" though the warping change amount was relatively large; however, as a result of the above-mentioned cold/hot cycle test, the ceramic substrate was broken, so that the evaluation was rejected "B". Accordingly, it was found that the effective results could not be obtained when the thickness of the first metal layer was 4.0 mm. In Comparative Example 3, although the evaluation of the cold/hot cycle reliability was good "A", the warping change amount was large as 1.3 mm or more and the element position deviation occurred, so that the evaluation was rejected "B". Accordingly, it was found that the effective results could not be obtained when the thickness T2 of the second metal layer was larger than the thickness T1 of the first metal layer.

INDUSTRIAL APPLICABILITY

It is possible to suppress the warping of the insulation circuit substrate with a heat sink in which the insulation circuit substrate having the metal layer and the heat sink having the metal layer with the different composition from the metal layer of the insulation circuit substrate are bonded.

REFERENCE SIGNS LIST

1 Insulation circuit board
2 Heat sink
11 Ceramic substrate
12 Circuit layer
13 Metal layer
14 Brazing material foil
21 First metal layer
22 Second metal layer
23 Ceramic board material
30 Element
31 Solder
100 Insulation circuit board with heat sink
120 Metal board for circuit layer
130 Metal board for metal layer
210 Metal board for first metal layer
220 Metal board for second metal layer

The invention claimed is:

1. An insulation circuit board with a heat sink, comprising an insulation circuit board provided with a ceramic substrate, a circuit layer joined to one side of the ceramic substrate, and a metal layer made of aluminum or aluminum alloy, which is joined to the other side of the ceramic substrate; and a heat sink joined to the metal layer, wherein the heat sink includes a first metal layer with a thickness T1 made of copper or copper alloy joined to the metal layer, a ceramic board material joined to an opposite side surface of the first metal layer to the metal layer, and a second metal layer with a thickness T2 made of copper or copper alloy joined to an opposite side surface to the first metal layer of the ceramic board material, and the thickness Ti of the first metal layer is not less than 1.0 mm and not more than 3.0 mm, and a thickness ratio T1/T2 is 1.0 or more.

2. The insulation circuit board with a heat sink according to claim 1, wherein the thickness ratio T1/T2 is not more than 10.0.

3. The insulation circuit board with a heat sink according to claim 1, wherein the thickness T2 of the second metal layer is not less than 0.3 mm.

4. The insulation circuit board with a heat sink according to claim 1, wherein the circuit layer is formed from aluminum or aluminum alloy, the ceramic substrate is formed from aluminum nitride, and the ceramic board material is formed from silicon nitride.

5. The insulation circuit board with a heat sink according to claim 1, wherein the metal layer and the first metal layer are solid-phase diffusion bonded.

6. The insulation circuit board with a heat sink according to claim 2, wherein the thickness T2 of the second metal layer is not less than 0.3 mm.

7. The insulation circuit board with a heat sink according to claim 2, wherein the circuit layer is formed from aluminum or aluminum alloy, the ceramic substrate is formed from aluminum nitride, and the ceramic board material is formed from silicon nitride.

8. The insulation circuit board with a heat sink according to claim 2, wherein the metal layer and the first metal layer are solid-phase diffusion bonded.

9. The insulation circuit board with a heat sink according to claim 3, wherein the metal layer and the first metal layer are solid-phase diffusion bonded.

10. The insulation circuit board with a heat sink according to claim 6, wherein the metal layer and the first metal layer are solid-phase diffusion bonded.

* * * * *